United States Patent [19]
Adams et al.

[11] Patent Number: 5,855,792
[45] Date of Patent: Jan. 5, 1999

[54] RINSE WATER RECYCLING METHOD FOR SEMICONDUCTOR WAFER PROCESSING EQUIPMENT

[75] Inventors: John A. Adams, Escondido; Gerald A. Krulik, San Clemente, both of Calif.

[73] Assignee: Integrated Process Equipment Corp., Phoenix, Ariz.

[21] Appl. No.: 855,688

[22] Filed: May 14, 1997

[51] Int. Cl.$^6$ .................................................. C02F 5/08
[52] U.S. Cl. ............................. 210/696; 134/10; 134/18; 134/902; 210/698; 210/739; 210/743; 210/765; 210/960; 433/906
[58] Field of Search ................................ 134/1.3, 18, 10, 134/25.1, 902; 210/696–701, 638, 639, 650, 743, 739, 765, 805, 900; 437/225; 438/906

[56] References Cited

U.S. PATENT DOCUMENTS

| | | | |
|---|---|---|---|
| 4,044,106 | 8/1977 | Fang | 423/312 |
| 4,124,504 | 11/1978 | Munden | 210/50 |
| 4,778,532 | 10/1988 | McConnell et al. | 134/10 |
| 4,788,043 | 11/1988 | Kagiyama et al. | 422/292 |
| 4,902,608 | 2/1990 | Lamb et al. | 430/325 |
| 4,997,490 | 3/1991 | Vetter et al. | 134/26 |
| 5,175,124 | 12/1992 | Winebarger | 437/180 |
| 5,190,065 | 3/1993 | Kovas et al. | 134/107 |
| 5,227,001 | 7/1993 | Tamaki et al. | 156/345 |
| 5,320,706 | 6/1994 | Blackwell | 156/636 |
| 5,501,741 | 3/1996 | McMahon | 134/13 |
| 5,542,441 | 8/1996 | Mohindra et al. | 134/95.2 |
| 5,656,097 | 8/1997 | Olesen et al. | 134/1 |

*Primary Examiner*—Peter A. Hruskoci
*Attorney, Agent, or Firm*—Quarles & Brady

[57] ABSTRACT

Waste water from an apparatus that rinses particles from semiconductor wafers is collected in a tank. A pump sends waste water from the tank through a particle filter and onward to a supply inlet for initial rinse stages of the processing apparatus. Some of the waste water is bleed from the tank and replenished by fresh water introduced into the final rinse stage of the apparatus. If the semiconductor processing so dictates, chemicals may be added to the waste water to alter the pH and/or prevent the precipitation of solids in the tank. The addition of such chemicals can be controlled automatically in response to sensed characteristics of the waste water.

20 Claims, 1 Drawing Sheet

RINSE WATER RECYCLING METHOD FOR SEMICONDUCTOR WAFER PROCESSING EQUIPMENT

BACKGROUND OF THE INVENTION

The present invention relates to semiconductor wafer fabricating equipment; and more particularly to apparatus for rinsing particles from semiconductor wafers during fabrication.

Semiconductor fabrication utilizes large quantities of water for rinsing the semiconductor wafers at different stages of fabrication, as well as for rinsing the equipment that processes the wafers. For example, the semiconductor wafer must be rinsed with water following polishing to flush away particles of the abrasive slurry which adheres to the wafer. In addition, the polishing pad is rinsed between operations to remove accumulated slurry and wafer particles which adhere to the pad so that those materials will not affect polishing of the next semiconductor wafer. Typical chemical mechanical planarization (CMP) equipment can consume two to eight gallons of water per minute. This equates to between 50 and 200 gallons of water per wafer depending on the number and type of operations being performed on each wafer.

Heretofore, such semiconductor wafer processing equipment was supplied with ultra pure, deionized water with a resistivity of about 18 mega-ohms, for example. After rinsing one semiconductor wafer or piece of the processing equipment, the water, now contaminated with waste particles and process chemicals, was discarded through a drain. The accepted principle is that if the waste water is recycled, particles of slurry and wafer material born by the waste water could damage the subsequently rinsed semiconductor wafers. Concern also existed that after a rinsing operation the waste water no longer has a neutral pH which also would adversely affect semiconductor wafers processed subsequently.

For example, silica CMP employs an alkaline abrasive slurry having a pH of 10.5–11.5 at working concentration. This slurry contains up to 10–12 percent by weight of silica as microscopic abrasive particles and ammonium, sodium, or potassium ions equivalent to about a 0.5–2.0 percent by weight solution of their respective hydroxide. In addition the slurry typically has several hundred parts per million of soluble silica as silicate. When the silica CMP processing solutions are diluted by the rinsing operation, the waste water may have a pH of about 9 and the dissolved silica begins to decompose forming insoluble silicon oxide particles.

The slurry used in metals CMP normally is acidic. Such a slurry that is widely used to remove tungsten consists of a dilute ferric nitrate solution having 0.5 to 3.0 percent by weight of microscopic, abrasive aluminum oxide (alumina) particles. Other types of abrasive solutions used in metals CMP include (a) ferrocyanide, organic acid and silica or alumina; (b) hydrogen peroxide and alumina; and (c) potassium periodate and alumina. When metals CMP processing solutions are diluted by the rinse operation, the pH changes due to dilution. Any alumina from the processing is essentially insoluble; whereas ferric nitrate from the processing hydrolyzes at a pH greater than 3 to give ferric hydroxide solids, free nitric acid and unhydrolyzed ferric nitrate. Ferric nitrate hydrolysis will reach an equilibrium with a concentration of free nitric acid which is sufficient to redissolve the ferric hydroxide precipitate. At this point the weakly acidic (pH 3–6) solution is stable and will keep the remaining ferric nitrate in solution.

Additional concerns have been expressed that ionic contamination will increase to unacceptable levels in a closed rinse water recycling system and adversely affect removal of particles from semiconductor wafers. Hence rinse water from standard chemical mechanical planarization (CMP) processing equipment was discarded after one rinse operation.

Therefore, conventional wisdom regarding semiconductor fabrication dictated that only ultra pure, deionized water be used so as not to contaminate or damage the semiconductor wafers. As a consequence it was not considered practical to recycle the waste water to rinse more than one semiconductor wafer. This consumption of water is not only wasteful, but the deionized water is expensive.

Thus previous approaches to re-using sent the rinse water back through a standard ultra-pure water processing system to regenerate 18 mega-ohm water with all particles removed. There are two options for repurifying the rinse water. One is to send filtered used rinse water to the main processing plant for the ultra pure water. However, this option is not recommended by many semiconductor manufacturers for fear of introducing undesirable impurities from the CMP operation into the entire purification plant. A more acceptable option is to use a separate ultra pure water purification system which is dedicated to processing the used rinse water. The water from this second purification system is used only back in the CMP equipment.

Both of these options are very costly to implement, with high capital and operating expenses. Furthermore due to the nature of the ultra pure water purification, a 25% to 40% of the incoming waste rinse water must be discarded.

SUMMARY OF THE INVENTION

A general object of the present invention is to provide a system for recycling rinse water used in semiconductor wafer processing equipment in a manner which will not adversely affect subsequent wafers cleaned with the recycled water.

Another object of the present invention is to provide a system which removes particulate matter from waste water being recycled.

A further object of the present invention is to provide a mechanism in the recycling system for bleeding off a portion of the used water and replenishing it with fresh deionized water.

Yet another object of the present invention is to provide an automatic mechanism to adjust the pH of the recycled water, if required by the particular processing operations.

These and other objectives are satisfied by a system for recycling water used to rinse particles and chemicals from semiconductor wafers during fabrication in a processing apparatus which has a drain outlet and a water inlet. That system includes a pump which sends waste water from the drain outlet through a particle filter. The filtered water is fed to the water inlet of the processing apparatus.

The preferred embodiment of the recycling system stores the unfiltered waste water in a tank from which the water in drawn by the pump. A predefined portion of the waste water is drained from the tank and replenished by fresh water, such as ultra pure, deionized water for example, that is introduced into the system. As required by the particular process employed to fabricate the semiconductor wafers, chemicals optionally may be fed into the tank to control the pH of the waste water and inhibit precipitation of solids in the tank. The addition of such chemicals can be controlled automatically in response to sensing characteristics of the waste water.

DETAILED DESCRIPTION OF THE INVENTION

Figure 1:
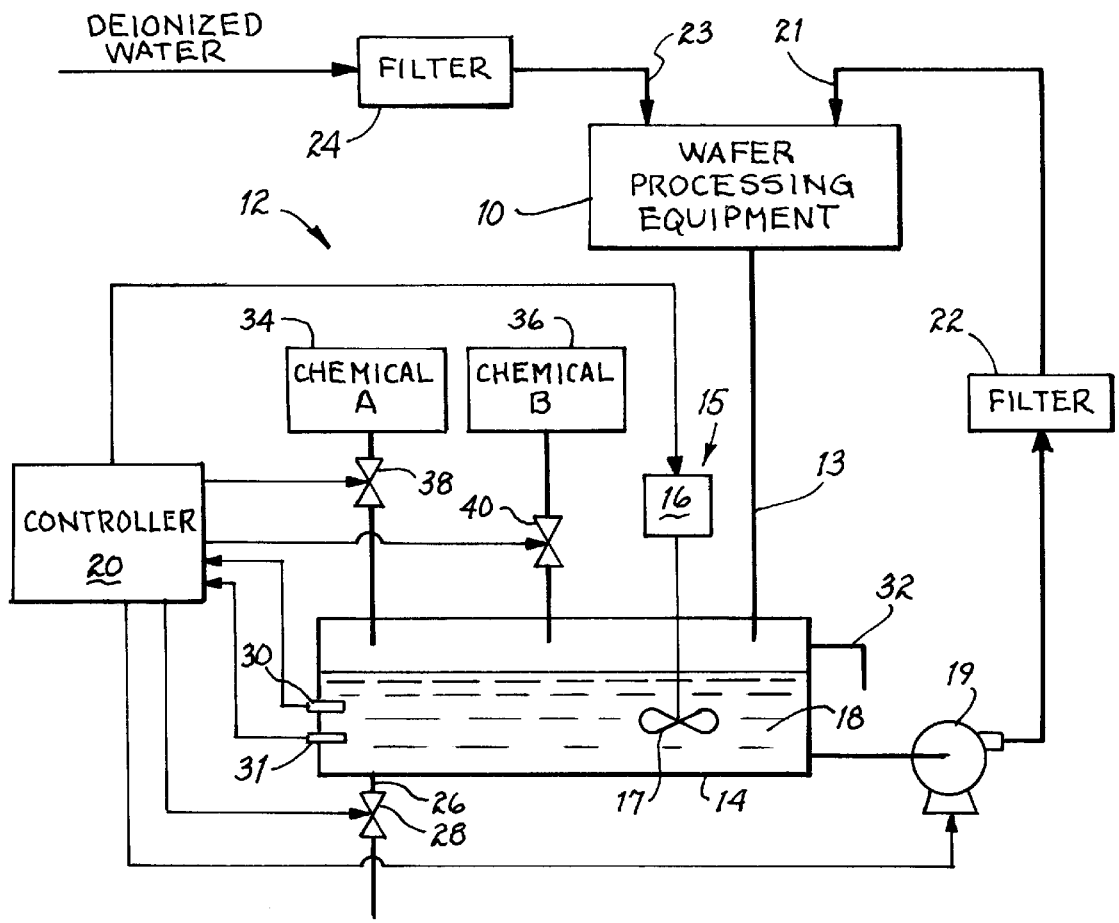
FIG. 1 is a block diagram of a rinse water recycling system for semiconductor wafer processing equipment.

With reference to FIG. 1, an apparatus 10 for processing semiconductor wafers is connected to a rinse water recycling system, generally designated as 12. Specifically, the drain line 13 from the processing apparatus 10 leads into an open holding tank 14 into which drains waste water containing particles, chemicals and other material from rinsing and other semiconductor wafer processing operations. An agitator 15 includes a motor 16 which drives a propeller 17 that is immersed in the tank 14 to stir the waste water 18. The agitator 15 is operated by the controller 20 to prevent suspended particles in the waste water 18 from settling to the bottom of the tank 14.

Water is drawn out of the tank 14 by a variable speed pump 19, the speed of which is determined by a signal from a controller 20. The output of pump 19 is connected to an inlet of a filter 22, such as an Exxflow™ cross-flow filtration system manufactured by Epoc Water Inc., Fresno, Calif. USA, which passes the water through open-ended, flexible cloth tubes to remove particles carried by the water, for example. Other types of filtration and solids removal methods also may be employed.

The filtered water then is fed to an inlet 21 for the initial rinsing stages of the semiconductor wafer processing apparatus 10. It is within these stages where the greatest amount of contaminants remains on the semiconductor wafer for removal by the water. The water inlet 23 for a final rinsing stage of the processing apparatus 10 is connected by a second filter 24 to a source of ultra pure, deionized (e.g. 18 mega-ohms resistivity) water. Thus the final rinsing stage, where a minimal amount of particles and chemicals remain on the semiconductor wafer, utilizes ultra pure water. Waste water from all of the rinsing stages of the processing apparatus 10 flows into drain line 13 to the tank 14.

The present inventors recognized that the large quantity of contaminants on the semiconductor wafers in the initial rinsing stages results in immediate contamination of the ultra pure water upon striking the wafer. Upon introduction into the rinse stage, the water quickly picks up particles and ions, as well as quickly changing pH. As a result of these effects, the water that runs through the rinsing stage only is ultra pure and deionized, prior to contacting a semiconductor wafer. Therefore, the present inventors concluded that the water supplied to the early rinsing stages does not have to be ultra pure and deionized, but merely particle free so as not to leave solid residue on the semiconductor wafer. This conclusion contradicts conventional wisdom with respect to rinsing semiconductor wafers which dictated that only ultra pure, deionized water should be supplied to all rinsing stages. In fact the present inventors found that ion free water can result in ionic precipitation and/or particle agglomeration on the semiconductor wafer surface during the initial rinsing process, making thorough cleaning of the wafer more difficult. Thus particle removal efficiency is enhanced by the presence of ions in the recycled water.

In view of these findings, the present rinse water recycling system 12 was added to the semiconductor wafer processing apparatus 10. The waste water that drains into the tank 14 is forced through the filter 22 back to the initial rinsing stages of the processing apparatus 10. After filtration, the recycled water for a silica CMP process is essentially particle free and has a slightly alkaline pH with only dilute ammonium, potassium or sodium ions as well as small amounts of hydroxide ions and dissolved silica. In other words, the filtered water will be better quality than ultra pure rinse water immediately after contact with a slurry coated semiconductor wafer. Thereafter there is no chemical difference in the used rinse water whether the starting water was ultra pure or particle-free diluted slurry rinse water.

As noted previously, the metals CMP processing solutions are diluted by the rinse operation causing the pH to rise. In the case of a commonly used solution formulation of ferric nitrate, alumina and water plus trace additives (such as Baikowsky 7-L), the alumina is essentially insoluble; whereas ferric nitrate from the processing hydrolyzes at high pH, greater than 3, to give ferric hydroxide solids, free nitric acid and unhydrolyzed ferric nitrate. Thus after filtration of waste water from metals CMP processing, the recycled water will be particle free and the weakly acidic (pH 3–6).

The particle free, diluted rinse water can completely replace the use of ultra pure water for rinsing in CMP application. Only the final rinse may need to use ultra pure water as dissolved liquids in that stage are easy to rinse off as compared with the solid silica, alumina or ionic hydroxide particles in previous rinse stages. An important benefit is that as the filtered metal CMP solution contacts a wafer which contains slurry residuals, the pH of the mixture will be lowered. This causes easier rinsing and inhibits production of hydrolyzed ion hydroxides, for example. Similar benefits occur with silica CMP rinses.

It is not feasible to recycle the water continuously as the concentration of dissolved residues in the filtered water will increase with each pass through the system. For practical operation, some of the circulating water must be bled from the system and discarded. As little as 5% or as much as 95% can be bled off per pass through the system, thus controlling the rate of increase of dissolved solids to maintain the ionic content at any desired level. Preferably, a bleed rate of about 10% to 35% of the water per pass through the system is preferred depending upon the processing application, the CMP slurry, and chemical concentrations.

To accomplish the bleed off, the tank 14 has an outlet conduit 26 connected to an electrically controlled valve 28 which is operated by the controller 20. The valve 20 leads to a standard drain to which waste water previously flowed from the wafer processing apparatus prior to the addition of the waste water recycling system 12. A plurality of sensors 30 and 31 are placed within tank 14 for measuring characteristics of the waste water 19, such as pH, electrical conductivity and temperature. Sensors 30 and 31 provide signals indicating the level of their respective characteristic to the controller 20. In response to the sensor signals, the controller 20 opens the bleed valve 28 until the waste water characteristic has the desired level due to dilution with the ultra pure deionized water from the final rinse stage of the processing apparatus 10. In addition, operator controls can be provided for manually setting the bleed rate provided by the valve 28. The tank 14 also has an overflow conduit 32 through which water drains from the tank when the level becomes too high. The water which is drained from the tank through conduits 26 and 32 is replenished by the ultra pure, deionized water applied to the final rinse stage of the semiconductor wafer processing apparatus 10. Alternatively where ultra pure water is not required in the final rinsing stage, recycled water may be used in all rinsing stages in which case, fresh ultra pure deionized water can be added directly to the tank 14 to replace waste water bled from the system.

As an alternative to sensing pH or conductivity, a flow meter could be incorporated into the drain line 13 from the wafer processing apparatus to measure the amount of water being discharged. The bleed valve 28 is controlled in response to the flow meter to remove a proportional amount of heavily contaminated water from the lower portion of the tank.

For metals CMP, controlled amounts of an organic acid, sulfamic acid or nitric acid may be added to the recycled rinse water in order to prevent precipitation of metallic solids, e.g. iron. Likewise it is possible to add extra ammonium, potassium or sodium hydroxide to the recycled rinse water in a silica CMP process to control hydrolysis of dissolved silicate ions. Dispersants, surfactants and other chemicals may also be added to the recycled water as needed.

Such chemical additives can be provided in storage vessels 34 and 36 with outlets connected through electrically controlled valves 38 and 40, respectively, that feed into the tank 14. The chemical feed valves 38 and 40 are operated by the controller 20 thereby regulating the amount of each chemical supplied to the tank 14. For example, where the chemical is used to control the pH of the recycled water, the controller 20 regulates the flow through the appropriate valve 38 or 40 in response to the pH level of the fluid within the tank as provided by the signal from a pH sensor 30.

As noted previously, the present inventors recognized that even the ultra pure, deionized water previously used exclusively to rinse semiconductor wafers quickly changed in pH and particle content upon coming into contact with the semiconductor wafer. As a consequence, the present system 12 by treating and recycling waste water from the semiconductor processing apparatus 10 is able to reduce the quantity of fresh ultra pure water utilized thus producing a cost benefit. Through the use of filters which remove particles carried by the waste water, the water may be recycled to the initial rinsing stages of the processing apparatus 10 or directly into the tank 14. The amount of particles in the water can be further reduced by bleeding off a portion of the recovered waste water which quantity is replaced by ultra pure deionized water fed to the final rinse stage of the processing apparatus 10. The pH of the waste water can also be adjusted by adding appropriate chemicals in response sensing the pH level.

Figure 2:
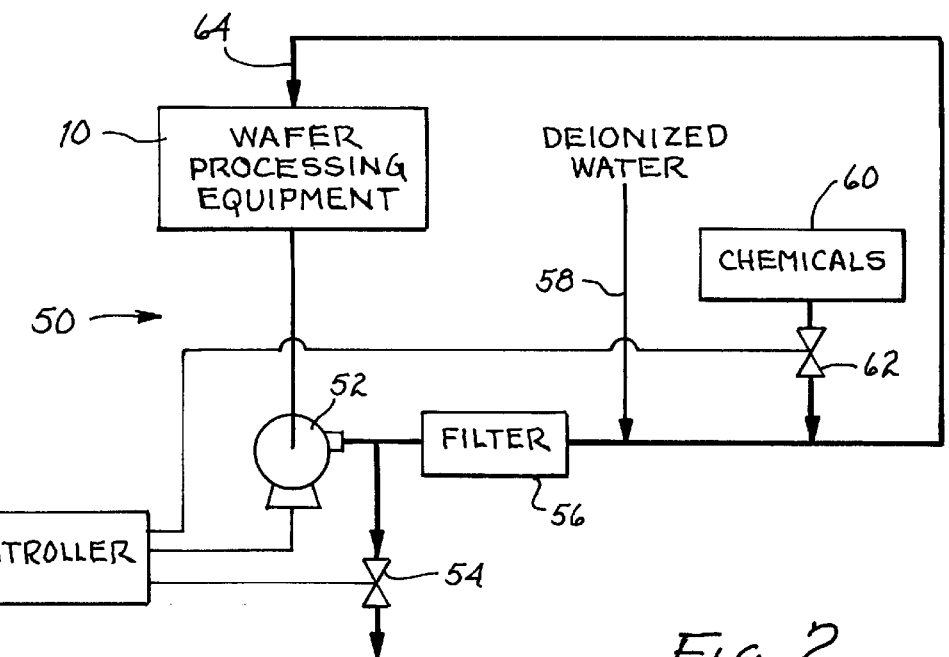
FIG. 2 is a block diagram of another embodiment of a rinse water recycling system according to the present invention.

FIG. 2 depicts an embodiment of a rinse water recycling system 50 which does not utilize a storage tank. In this arrangement the waste rinse water from the semiconductor wafer processing equipment 10 flows directly to an input of pump 52. The output of the pump 52 is connected to a bleed valve 54 which along with the pump is operated by a controller 55. As in the system of FIG. 1, the bleed valve 54 is controlled to drain off a predefined amount of waste water. A filter 56 or other solids removal device is coupled to the pump output.

Deionized water is added to the system through conduit 58 to replenish water that was drained off via bleed valve 54. As in the previous embodiment, the recirculating rinse water may be treated with one or more chemicals 60 that are applied in a regulated manner through valve 62. Then the recycled rinse water flows to the supply inlet of the semiconductor processing apparatus 10.

We claim:

1. A method for recycling water used to rinse particles from semiconductor wafers in a processing apparatus, said method comprising the steps of receiving waste water from an outlet of the processing apparatus; removing particles from waste water to produce less than ultra pure, deionized water; and supplying the less than ultra pure, deionized water to an inlet of the processing apparatus to rinse particles from a wafer, then supplying ultra pure, deionized water to said processing apparatus to rinse particles from said wafer, wherein said less than ultra pure, deionzed water is free of sufficient particles so as not to leave a solid residue on said wafer.

2. The method as recited in claim 1 further comprising collecting the waste water received from the outlet of the processing apparatus in a tank; and pumping the waste water from the tank through a filter system.

3. The method as recited in claim 2 further comprising agitating the waste water in the tank.

4. The method as recited in claim 1 further comprising a draining off a portion of the waste water received from the processing apparatus; and adding fresh water to the flow of water between the between the outlet and the inlet.

5. The method as recited in claim 1 further comprising adding a chemical to water flowing between the outlet and the inlet to alter a pH level of the water.

6. The method as recited in claim 5 further comprising measuring a characteristic of the waste water which indicates the pH level; and controlling addition of the chemical in response to measuring the characteristic.

7. The method as recited in claim 5 further comprising measuring a pH level of the waste water; and controlling addition of the chemical in response to the pH level.

8. A method for recycling water used to rinse particles from semiconductor wafers in a processing apparatus which has a drain outlet and an inlet, said method comprising step of:

receiving water from the drain outlet in a vessel;

pumping water from the vessel;

removing particles from the water pumped from the vessel to produce less than ultra pure, deionized water for supply to said processing apparatus;

draining off a portion of the waste water received from the drain outlet; and adding fresh water to rinse particles from a wafer after said less than ultra pure, deionized water is supplied to said processing apparatus to rinse particles from said wafer, a flow of water between the drain outlet and the inlet of the processing apparatus, wherein said less than ultra pure, deionized water is free of sufficient particles so as not to leave a solid residue on said wafer.

9. The method as recited in claim 8 further comprising measuring a characteristic of water received from the drain outlet to produce a measurement; and in response to the measurement, controlling the step of draining off a portion of the waste water.

10. The method as recited in claim 8 further comprising measuring a characteristic of water received from the drain outlet to produce a measurement; and in response to the measurement, controlling the step of agitating water in the tank.

11. The method as recited in claim 8 wherein the vessel is a tank; and said method further comprises agitating water in the tank.

12. The method as recited in claim 8 further comprising adding a chemical to alter a pH level of water flowing between the drain outlet and the inlet.

13. The method as recited in claim 12 further comprising measuring the pH level of water received from the drain outlet to produce a measurement; and in response to the measurement, controlling the step of adding the chemical.

14. The method as recited in claim 8 further comprising adding a chemical to water flowing between the drain outlet and the inlet to inhibit precipitation of solids.

15. The method as recited in claim 14 further comprising measuring a characteristic of the water received from the drain outlet to produce a measurement; and in response to the measurement, controlling the step of adding the chemical.

16. A method for recycling water used to rinse particles from semiconductor wafers in a processing apparatus having an initial rinse stage which receives water from a first inlet, a final rinse stage which receives water from a second inlet, and a drain outlet; said method comprising steps of:

pumping water received from the drain outlet;

removing particles from the water pumped from the drain outlet to produce filtered, ionized water;

supplying the filtered, ionized water to the first inlet of the apparatus to rinse particles from a wafer draining off a portion of the waste water received from the drain outlet; and adding fresh, deionized water to the second inlet of the processing apparatus to rinse particles from said wafer, wherein said filtered, ionized water is free of sufficient particles so as not to leave a solid residue on said wafer.

17. The method as recited in claim 16 further comprising receiving waste water from the drain outlet into a tank; and agitating the water in the tank.

18. The method as recited in claim 16 further comprising measuring a characteristic of the waste water received from the drain outlet to produce a measurement; and in response to the measurement, adding a chemical to water flowing between the drain outlet and the first inlet.

19. The method as recited in claim 16 further comprising measuring the pH level of water received from the drain outlet to produce a measurement; and in response to the measurement, adding a chemical to alter a pH level of water flowing between the drain outlet and the first inlet.

20. The method as recited in claim 16 further comprising measuring a characteristic of the water received from the drain outlet to produce a measurement; and in response to the measurement, adding a chemical to water flowing between the drain outlet and the first inlet to inhibit precipitation of solids.

* * * * *